(12) United States Patent
Shih et al.

(10) Patent No.: US 7,916,443 B2
(45) Date of Patent: Mar. 29, 2011

(54) ANTISTATIC DEVICE WITH MULTIPLE DISCHARGING INTERVALS

(75) Inventors: Hung Jung Shih, Hsinchu (TW); Ta-Yuan Lin, Hsinchu (TW)

(73) Assignee: Getac Technology Corp., Taipei (TW)

( * ) Notice: Subject to any disclaimer, the term of this patent is extended or adjusted under 35 U.S.C. 154(b) by 482 days.

(21) Appl. No.: 12/167,929

(22) Filed: Jul. 3, 2008

(65) Prior Publication Data

US 2010/0002346 A1  Jan. 7, 2010

(51) Int. Cl.
*H02H 7/20* (2006.01)

(52) U.S. Cl. .................................. 361/112; 361/220

(58) Field of Classification Search .............. 361/112, 361/129, 130, 212, 220
See application file for complete search history.

(56) References Cited

U.S. PATENT DOCUMENTS

| | | | | |
|---|---|---|---|---|
| 3,679,939 A | * | 7/1972 | Nitta et al. | 361/120 |
| 3,743,884 A | * | 7/1973 | Wafer et al. | 361/16 |
| 4,438,365 A | * | 3/1984 | Atkinson | 313/325 |
| 4,546,402 A | * | 10/1985 | deSouza et al. | 361/120 |
| 4,860,156 A | * | 8/1989 | Stenstrom et al. | 361/128 |
| 4,939,618 A | * | 7/1990 | Fingerson et al. | 361/117 |
| 5,995,353 A | * | 11/1999 | Cunningham et al. | 361/111 |
| 6,111,740 A | * | 8/2000 | Danowsky et al. | 361/120 |
| 7,438,742 B2 | * | 10/2008 | Smith | 95/57 |
| 7,663,856 B2 | * | 2/2010 | Breuer et al. | 361/120 |
| 7,787,230 B2 | * | 8/2010 | Michalopoulos et al. | 361/112 |

* cited by examiner

*Primary Examiner* — Jared J Fureman
*Assistant Examiner* — Christopher J Clark
(74) *Attorney, Agent, or Firm* — Apex Juris, pllc; Tracy M Heims

(57) ABSTRACT

An antistatic device with multiple discharging intervals is applied to electrical components for providing an optimized protection against ESD (Electrostatic Discharge). The antistatic device includes a trace, a discharging portion and multiple grounding portions. The trace allows electrostatic current to pass through. The discharging portion is coupled to the trace. The grounding portions are placed around the discharging portion. A discharge interval between each of the grounding portions and the discharging portion allows the electrostatic current to be discharged through any of the grounding portions. Each of the discharging intervals is equidistant to facilitate equal discharge probabilities.

18 Claims, 3 Drawing Sheets

ANTISTATIC DEVICE WITH MULTIPLE DISCHARGING INTERVALS

FIELD OF THE INVENTION

The invention is related to an antistatic device, and more particularly to an antistatic device having multiple discharging intervals.

DESCRIPTION OF PRIOR ART

The phenomenon of electrostatic discharge (ESD) is one of the main factors that cause damages to electrical components or electrical systems. The damage caused by ESD often destroys semiconductor components, which consequently affects the functionality of integrated circuits and leads to the malfunctioning of electronic products. Conventionally, prevention of ESD is usually achieved by using the point discharge effect, which employs discharging points for guarding against ESD inside the electrical devices. Generally two conductive points are placed oppositely to generate the point discharge effect in a circuit. The electrical current of ESD generated abruptly is guided into a grounding end of the circuit, thereby protecting ESD-sensitive components or micro-circuits from malfunctions caused by ESD damages.

However, the use of the point discharge effect to stimulate and discharge generated electrostatic current in prior art often fails in actual operation. The major factors leading to such a failure include: (1) a distance between the two conductive points is inadequate; (2) other discharging intervals may appear: the electrical arcs of electrostatic current usually do not travel in straight lines; as long as any other conductors are within range of the conductive points the electrical arcs may form new discharging intervals with other conductors; (3) consecutive and multiple discharging: after many times of discharging the tips of the conductive points may become oxidized or carbonized, which makes the conductive points become round at the tips and consequently impedes the point discharge effect.

Therefore, the aforesaid problems commonly observed in the antistatic device of prior art become an issue that requires an urgent solution.

SUMMARY OF THE INVENTION

An antistatic device having multiple discharging intervals has been proposed in the invention. The device of the invention allows one discharging point to correspond to multiple grounding ends, so as to generate multiple discharging intervals. When the number of discharging intervals is increased, the odds of successfully stimulating and discharging electrostatic current may be elevated, so that the generated electrostatic current may be discharged more easily via multiple discharging intervals, thereby increasing the lifespan of the discharging points and the grounding ends.

According to one aspect of the present invention, an antistatic device comprises a trace, a discharging portion, and multiple grounding portions. The trace allows electrostatic current to pass through it. The discharging portion is coupled to the trace. The grounding portions are placed around the discharging portion. A discharging interval between each of the grounding portions and the discharging portion is equidistant, so as to allow the generated electrostatic current to be discharged through the discharge interval to one of the grounding portions randomly.

According to another aspect of the present invention, another antistatic device comprises a trace, and multiple grounding portions. The trace has a discharging point coupled thereto so as to allow electrostatic current to pass through. Each of the grounding conductors has a grounding end formed thereon and is placed around the discharging point of the trace. The distance between each of the grounding ends and the discharging point is identical. A discharging interval between each of the grounding ends and the discharging point is equidistant, so as to allow the generated electrostatic current to be discharged through the discharge interval to one of the grounding conductors randomly.

These and other features, aspects, and advantages of the present invention will become better understood with reference to the following description and appended claims. It is to be understood that both the foregoing general description and the following detailed description are examples, and are intended to provide further explanation of the invention as claimed.

BRIEF DESCRIPTION OF DRAWINGS

The present invention can be more fully understood by reference to the following description and accompanying drawings, in which.

DETAILED DESCRIPTION OF PREFERRED EMBODIMENTS

Figure 1:
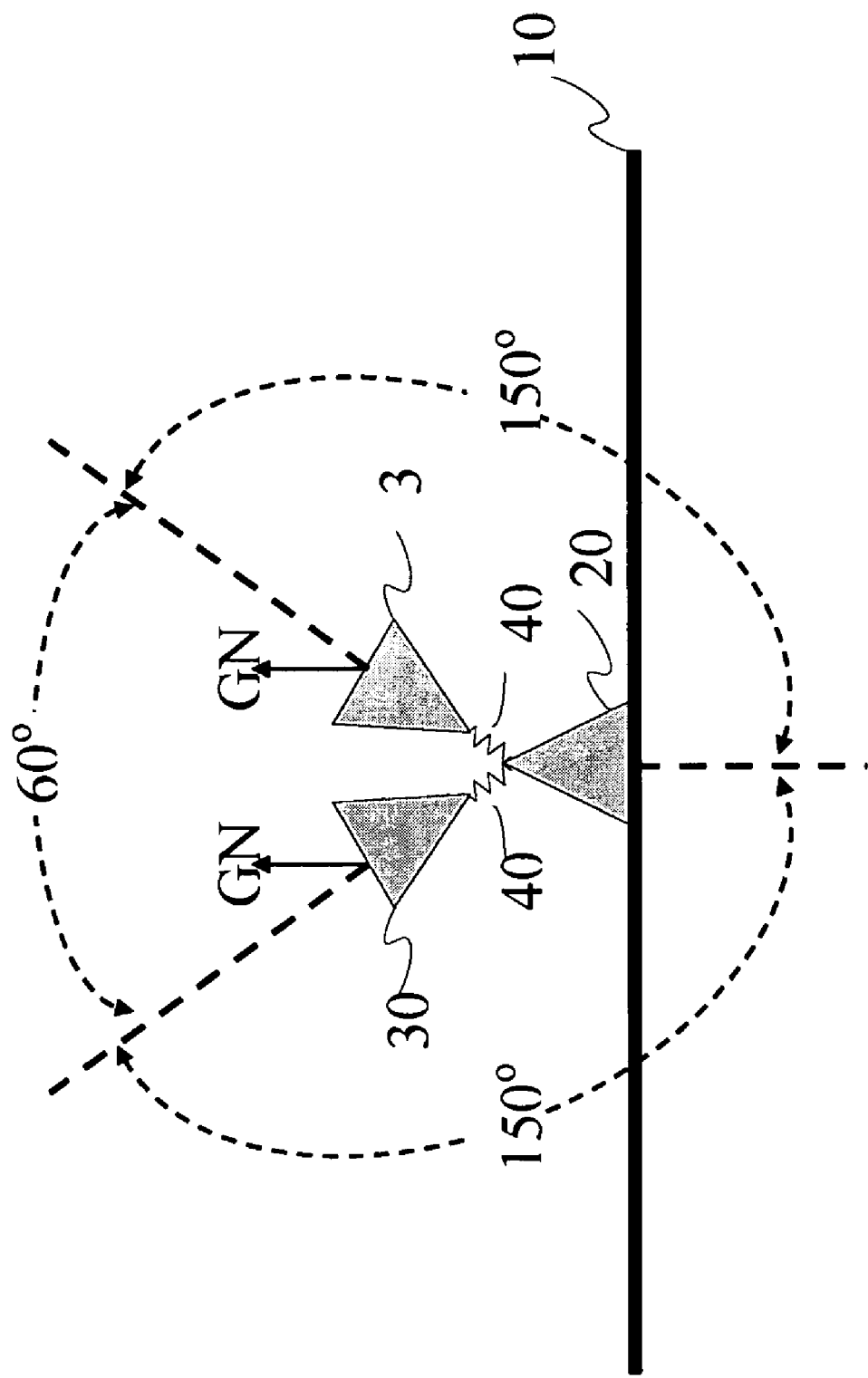
FIG. 1 is a schematic view according to a first embodiment of the invention, showing an antistatic device with multiple discharging intervals.

Reference will now be made in detail to the preferred embodiments of the present invention, examples of which are illustrated in the accompanying drawings. Wherever possible, the same reference numbers are used in the drawings and the description refers to the same or the like parts.

Referring to FIG. 1, which is a schematic view that shows an antistatic device having multiple discharging intervals according to a first embodiment of the invention. The antistatic device includes a trace 10, a discharging portion 20, and multiple grounding portions 30.

The trace 10 is basically an electrical wire and may be used for transmitting data, electrical currents, and electrical voltage in general circuits, and electrostatic current may also be transmitted via the trace 10. Since the trace 10 allows for transmission of electrostatic current, it means the electrostatic current may also abruptly arise in the trace 10. Thus the discharging portion 20 may be positioned throughout the trace 10 where ESD may occur.

The discharging portion 20 is an electrical conductor coupled to the trace 10. The grounding portions 30 are placed around the discharging portion 20. A discharging interval 40 is formed between each of the grounding portions 30 and the discharging portion 20 so as to allow the electrostatic current to be discharged, and each of the discharging intervals 40 are positioned equidistantly.

To protect the internal circuits from being damaged by ESD, electrostatic current must be released adequately. The point discharge effect has been utilized to release electrostatic current in this invention. The underlying principle of the point discharge effect is briefly described here: the occurrence of point discharge is determined mainly by the strength of electrical fields; when a conductive body carries electrical charges and the internal electrical field of the conductive body is zero, these electrical charges are distributed on the surface of the conductive body. When equilibrium is reached the surface of the conductive body turns into an equipotential surface, and the greater the curvature of the surface of an object is the higher the charge density becomes; in contrast, the smaller the curvature of the surface of an object is the lower the charge density gets. Under the influence of a strong electrical field, locations with greater surface curvature (such as the points of sharp and tiny objects) have higher charge density, denser equipotential surface, and stronger electrical fields, which subsequently ionizes the air surrounding the object into positive and negative ions. The point attracts ions of opposite polarity, resulting in discharge, which constitutes the point discharge effect.

The discharging portion 20 of the invention thus has at least one discharging point, and each of the grounding portions 30 also has at least one grounding end. It may be observed in FIG. 1 that the shape of the discharging portion 20 may be a triangle, while the shape of the grounding portions 30 may also be a triangle; wherein each side of the triangle that may be used as the discharging portion 20 or the grounding portions 30 is approximately, but not limited to, 7 mils (1 mil=0.001 inch).

Take FIG. 1 as an example. In the first embodiment of the present invention, one discharging portion 20 is designed to locate corresponding to two grounding portions 30, with the two grounding portions 30 positioned equidistantly and symmetrically in front of the discharging portion 20 within a range of 180 degrees. Therefore, if the number of the grounding portions 30 is two, the two grounding portions 30 may be positioned at preferred angles of 150±5 degrees respectively from the discharging portion 20; namely, the angle between the two grounding portions 30 will be 60±5 degrees. Consequently, two discharging intervals 40 are formed between the grounding ends of the grounding portions 30 and the discharging point of the discharging portion 20, and the distance between each of the grounding ends and the discharging point is identical. Moreover, this distance is exactly the length of the discharging interval 40, and this distance is approximately (but not limited to), 3 mils.

When the trace 10 abruptly generates electrostatic current or comes under the influence of ESD, the electrostatic current is guided into the discharging portion 20 via the trace 10, and discharged by means of the point discharge effect via the corresponding grounding portion 30, so as to guide the electrostatic current into a grounding layer or a grounding of the system, thereby neutralizing the electrostatic current. Accumulation of electrostatic current and the damage of internal components of circuits may thus be prevented, protecting the components from being damaged.

In this invention it is proposed that each said discharging portion 20 may simultaneously correspond to a plurality of the grounding portions 30. Therefore the electrostatic current may be allowed to generate a point discharge through one of these multiple discharging intervals 40 randomly, thereby increasing the odds of successfully stimulating and discharging electrostatic current by means of the point discharge effect. In prior art it is common to see a grounding end positioned directly in front of a discharging point. However, since the electrical arcs of electrostatic current do not always travel in straight lines the discharging interval formed between the discharging point and the grounding end disposed right in front thereof is often rendered ineffective, hindering electrostatic current from being guided smoothly into the grounding end for discharging, and consequently damaging circuit components. Because discharging intervals for electrical arcs of electrostatic current may appear within a range of 180 degrees in front of discharging point, the invention proposes that as many grounding portions as is practical should be positioned within the range of 180 degrees in front of the discharging point of each said discharging portion 20, so as to form as many discharging intervals as possible. Because the length of the discharging interval is critical in deciding whether the ESD is successful or not (the smaller the length is the more likely the ESD is to succeed), the distance between the grounding end of each of the grounding portions 30 and the discharging point is designed to be identical, which means each of the discharging intervals is positioned equidistantly. Hence it is not possible to cause the fact that the distance between some grounding ends and discharge point is far away from each other. Accordingly, the discharging intervals that would not be passed through by the electrical arcs of electrostatic current would not be formed. This can prevent the grounding ends from malfunction.

Moreover, because only one discharging interval is present in the prior arts, the discharging point and the grounding end often wear off easily, and readily become oxidized (carbonized) at the tips after discharging electrostatic current repeatedly, leading to failures of ESD. In an antistatic device with multiple discharging intervals of the invention, because one discharging portion 20 has multiple discharging intervals for discharging electrostatic current (in actual case of ESD, discharge once may be achieved via only one discharging interval, or via multiple discharging intervals simultaneously), the lifespan of the discharging point and the grounding ends may last longer than that in the prior art. Therefore, after discharging electrostatic current for the same number of times, the discharging point and the grounding end of the prior art may have become oxidized (carbonized) at the tips (consequently leading to ESD failure), while the discharging point and the grounding ends of the invention may still discharge electrostatic current effectively.

Figure 2:
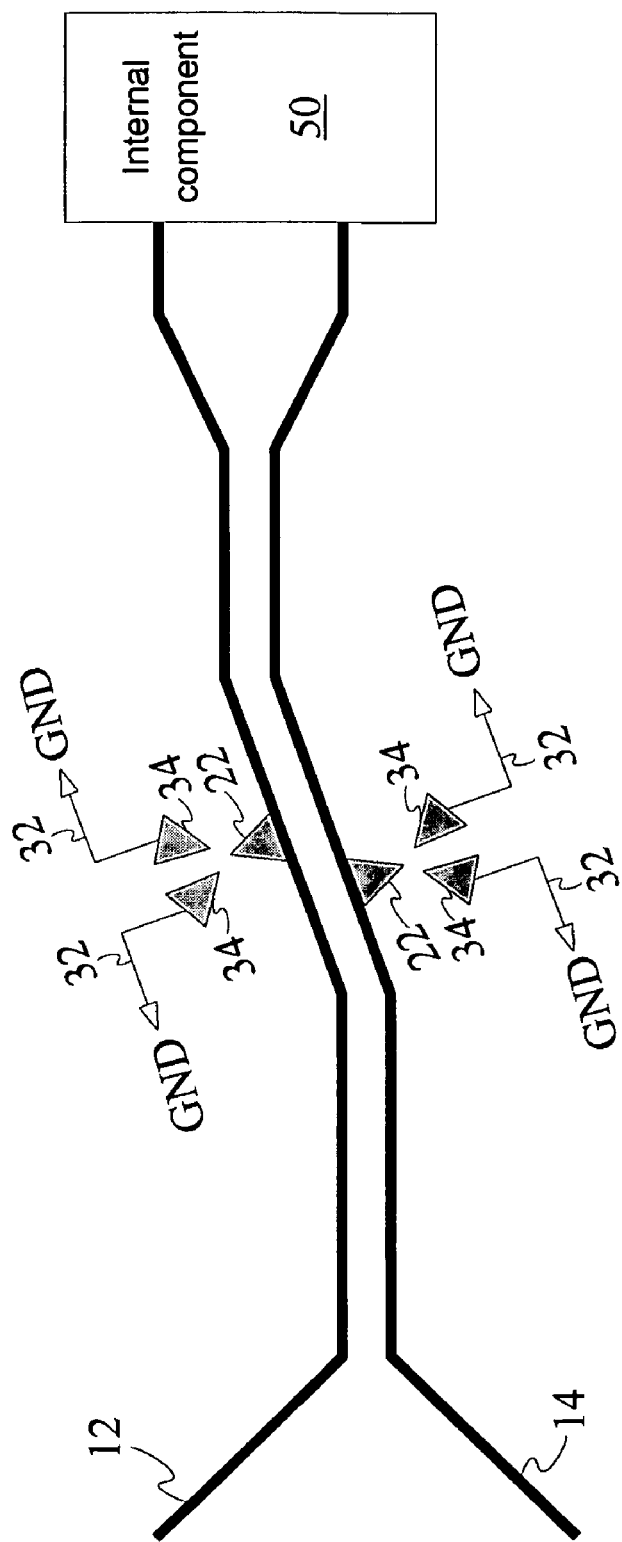
FIG. 2 is a schematic view according to a second embodiment of the invention, showing another antistatic device with multiple discharging intervals.

FIG. 2 is a schematic view that shows an antistatic device having multiple discharging intervals according to a second embodiment of the invention, and two traces of the circuit are randomly chosen to explain the second embodiment. Generally, a circuit has a positive electrode and a negative electrode, and signals may be completely transmitted between the positive electrode and the negative electrode. In FIG. 2, a trace 12 represents the positive electrode, while a trace 14 represents the negative electrode, so that signals may be transmitted in between the two.

The traces 12 and 14 are used for transmitting signals under normal circumstances, and when electrostatic current arises the electrostatic current may also be guided and transmitted via the traces 12 and 14. Because the traces 12 and 14 allow electrostatic current to pass through them, it is necessary to prevent electrostatic current from flowing into and damaging an internal component 50 via the traces 12 and 14, so discharging points 22 are placed on the traces 12 and 14.

In a circuit board there may be only a specific layer used as the grounding layer or there may be only one common grounding terminal, but different sets of circuitry may use different grounding conductors separately for connecting to the grounding layer or the grounding terminal, so as to achieve grounding. The device of the invention includes a plurality of grounding conductors 32, where each of the grounding conductors 32 has a grounding end 34 formed thereon, and the grounding conductors 32 are placed around the discharging points 22 of the traces 12 and 14 (in FIG. 2, two grounding ends are used as an example, but the invention is not limited thereto). The distance between each of the grounding ends 34 and the discharging points 22 is identical, and a discharging interval is formed between each of the grounding ends 34 and the discharging points 22, so as to allow electrostatic current to be discharged.

Figure 3:
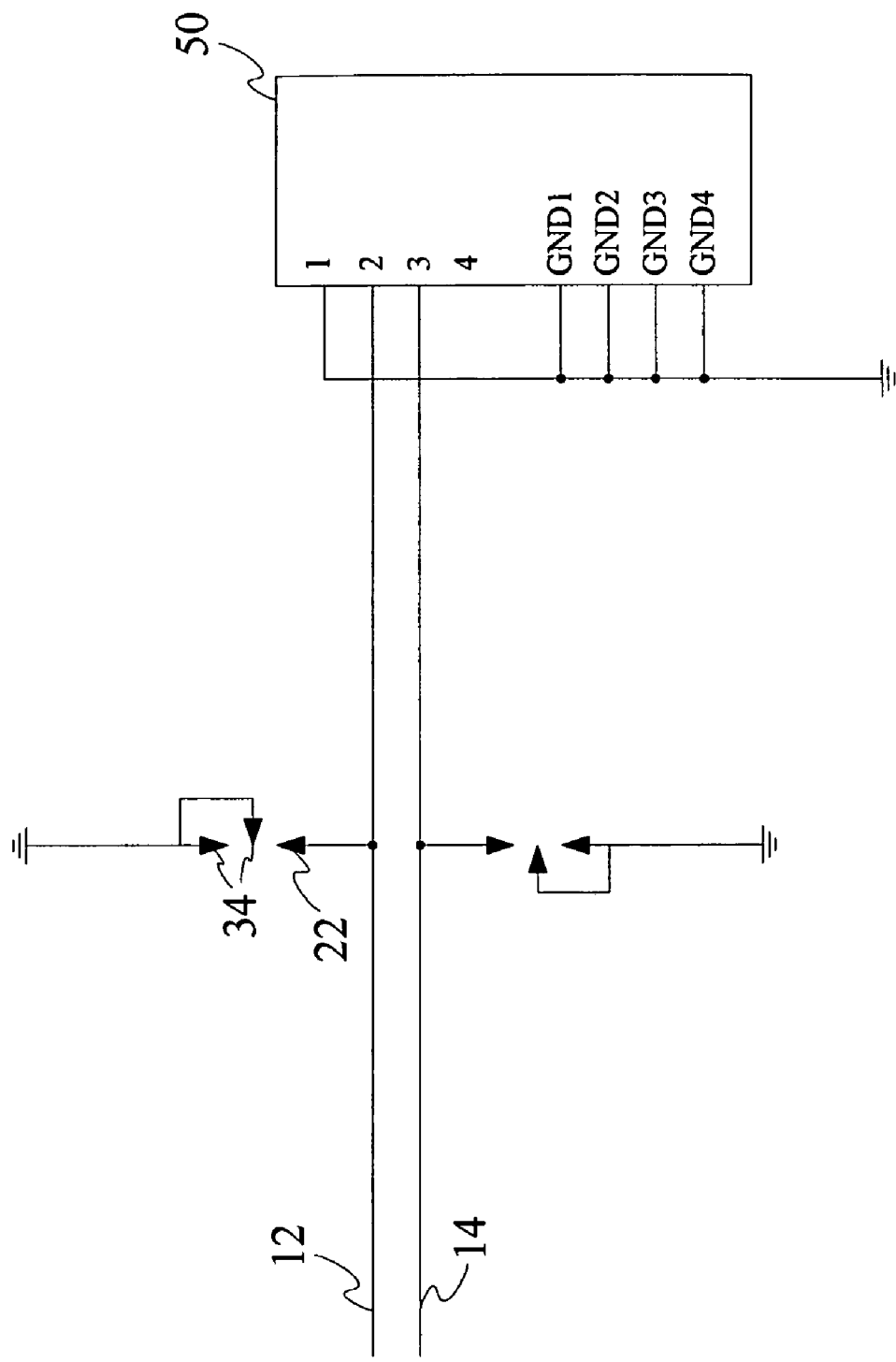
FIG. 3 is a schematic view that shows the circuit of FIG. 2.

FIG. 3 is a schematic view that shows the circuit of FIG. 2. It may be observed in FIG. 3 that the internal component 50 transmit signals via the traces 12 and 14, and the traces 12 and 14 have multiple discharging intervals made up by the discharging points 22 and the grounding ends 34, which may effectively guide electrostatic current into the grounding layer or the grounding terminal, and serve to guard against electrostatic current.

In the prior art it is common to use ESD generators, or ESD simulators, also known as ESD guns, for testing whether electronic equipment may function normally subsequent to external ESD. The ESD gun is an important tool for testing the ESD immunity of electronic equipment, and since the ESD is often in the form of fast elevation of electrical voltage, with the time of elevation often less than 1 ns (nanosecond) and approximately 0.7 ns, components of the electronic equipment need to have high functionality in order for the electronic equipment to pass testing by the ESD gun. The demand of high functionality for the components of the electronic equipment ensures said electronic equipment operate stably and reliably.

However, the ESD guns of the prior arts complete ESD in approximately 0.7 ns, while components for guarding against ESD disposed in general electronic equipment usually need to spend approximately 0.7 to 1 ms (millisecond) for starting up, which is too long for them to guard against ESD by the ESD guns in time. Therefore, when attempting to meet the testing requirement of ESD guns it is insufficient to rely only on the components for guarding against ESD. Consequently, components of point discharge are usually placed at the front of said components in the prior arts, where the components of point discharge are used to stimulate ESD, as well as buffering the time required for starting the components for guarding against ESD at the rear ends. However, the components of point discharge used in the prior art usually have a single discharging interval each, which makes the stimulation of discharging ESD prone to failure. Therefore, an antistatic device having multiple discharging intervals of the invention effectively increases the odds of successfully stimulating ESD.

Furthermore, industrial regulations of IC Design state that pins in each integrated circuit must be able to withstand 2 KV of ESD voltage. After carrying out relevant experiments, it has been revealed that in an antistatic device having multiple discharging intervals, each pin of each integrated circuit may withstand electrical voltage as high as 4 KV, which effectively doubles the electrical voltage tolerance of the pins using the prior art, and enhances significantly the effects of guarding against ESD.

The angle arrangements of the grounding portions/ends are not limited to the embodiments of the present invention; as long as the grounding portions/ends are positioned equidistantly and symmetrically in front of the discharging portion/ end within a range of 180 degrees. For example, when the two grounding portions (or the grounding ends) are positioned equidistantly and symmetrically, the angle between the two ground portions (use the front end of the discharging portion/ end as the center) may be 10, 20, 30, 40, 50, 70, 80, 90, 100, 110, 120, 130, 140, 150, 160 or 170 degrees; each angle has a range of ±5 degrees.

The embodiments described above are meant to illustrate the preferred embodiments of the present invention and are not meant to limit the scope of the present invention; those skilled in the relevant fields should understand that the modification and changes made to the embodiments are within the scope of the present invention. Thus, the scope of the protection should be determined by the following claims.

What is claimed is:

1. An antistatic device, comprising:
   a trace allowing electrostatic current to pass through;
   a discharging portion being coupled to the trace; and
   a plurality of grounding portions placed around the discharging portion;
   wherein a discharge interval between each of the grounding portions and the discharging portion is equidistant to allow the electrostatic current to be discharged through the discharging interval to one of the grounding portions randomly.

2. The antistatic device of claim 1, wherein the discharging portion has at least one discharging end and each of the grounding portions has at least one grounding end respectively.

3. The antistatic device of claim 2, wherein a distance between the discharging end and each of the grounding ends is identical.

4. The antistatic device of claim 3, wherein the distance is approximately 3 mils.

5. The antistatic device of claim 1, wherein the discharging portion is triangle shaped.

6. The antistatic device of claim 5, wherein the length of each side of the triangle shaped discharging portion is approximately 7 mils.

7. The antistatic device of claim 1, wherein the grounding portion is triangle shaped.

8. The antistatic device of claim 7, wherein the length of each side of the triangle shaped grounding portion is approximately 7 mils.

9. The antistatic device of claim 1, wherein the number of the grounding portions is two, each of the grounding portions being positioned equidistantly and symmetrically in front of the discharging portion within a range of 180 degrees.

10. The antistatic device of claim 1, wherein the number of the grounding portions is two, the angles between the two grounding portions and the discharging portion being 150±5 degrees respectively, the angle between the two grounding portions being 60±5 degrees.

11. An antistatic device, comprising:
    a trace with a discharging end coupled thereto, allowing electrostatic current to pass through; and
    a plurality of grounding conductors, each having a grounding end and being placed around the discharging end of the trace;
    wherein a distance between each of the grounding ends and the discharging end is identical and used as a discharging interval, so as to allow the electrostatic current to be discharged to one of the grounding conductors randomly.

12. The antistatic device of claim 11, wherein the distance is approximately 3 mils.

13. The antistatic device of claim 11, wherein the discharging end is triangle shaped.

14. The antistatic device of claim 13, wherein the length of each side of the triangle shaped discharging end is approximately 7 mils.

15. The antistatic device of claim 11, wherein the grounding end is triangle shaped.

16. The antistatic device of claim 15, wherein the length of each side of the triangle shaped grounding end is approximately 7 mils.

17. The antistatic device of claim 11, wherein the number of the grounding ends is two, each of the grounding ends being positioned equidistantly and symmetrically in front of the discharging end within a range of 180 degrees.

18. The antistatic device of claim 11, wherein the number of the grounding ends is two, the angles between the two grounding ends and the discharging end being 150±5 degrees respectively, the angle between the two grounding ends being 60±5 degrees.

* * * * *